United States Patent [19]

Suzuki

[11] 4,299,679
[45] Nov. 10, 1981

[54] METHOD OF PRODUCING JOSEPHSON ELEMENTS OF THE TUNNELING JUNCTION TYPE

[75] Inventor: Hideo Suzuki, Yokohama, Japan
[73] Assignee: Fujitsu Limited, Kawasaki, Japan
[21] Appl. No.: 105,011
[22] Filed: Dec. 19, 1979

[30] Foreign Application Priority Data

Dec. 27, 1978 [JP] Japan .................... 53-162282

[51] Int. Cl.$^3$ ................ C23C 15/00; H01L 39/22
[52] U.S. Cl. ...................... 204/192 EC; 29/599;
357/5; 427/39
[58] Field of Search ................ 427/39; 357/5;
204/192 E, 164, 192 S, 192 SP, 192 EC; 29/599

[56] References Cited

PUBLICATIONS

L. O. Mullen et al., "Fabrication of Tunnel Junctions on Niobium Films", *J. Appl. Phys.*, vol. 40, pp. 2115-2117 (1969).

G. Folens et al., "Production of Superconducting Proximity Junctions by RF-Sputtering & Photolithographic Techniques", *LeVide*, vol. 31, pp. 142-147 (1976).

*Primary Examiner*—Aaron Weisstuch
*Attorney, Agent, or Firm*—Staas & Halsey

[57] ABSTRACT

In a method of producing a Josephson element of the tunneling junction type comprising the steps of forming the first electrode by utilizing a photoresist film, forming a barrier oxide film on the first electrode by an rf oxygen glow discharge process and forming the second electrode, the improvement wherein immediately after depositing a film of super-conductor material to form the first electrode film, the superconducting material film is oxidized in the same apparatus in which the superconducting material was deposited.

10 Claims, 13 Drawing Figures

METHOD OF PRODUCING JOSEPHSON ELEMENTS OF THE TUNNELING JUNCTION TYPE

BACKGROUND OF THE INVENTION

1. Field of the Invention

The present invention relates to an improvement of a method of producing Josephson elements of the tunneling junction type having two superconductor metal films and a thin insulating film between the superconducting metal films.

2. Description of the Prior Art

FIG. 1 is a perspective view of such a Josephson element of the tunneling junction type. In FIG. 1, a the first electrode (i.e. a base electrode) 1 and a second electrode (i.e. a counter electrode) 2 are made of superconducting materials and are a few thousand angstroms thick. A thin insulating film 3 is made of oxide, is 10~50 angstroms thick and serves as a tunneling barrier.

The above-mentioned Josephson element has a current-voltage characteristic as illustrated in FIG. 2. In FIG. 2, $I_C$ represents the critical current, i.e. the maximum current which can flow at the zero voltage. In the case where a logic circuit is composed of Josephson elements, it is necessary to decrease or eliminate the difference between the critical currents of the Josephson elements. The critical current $I_C$ of a Josephson element is dependent upon the thickness and the area of the oxide film 3 of the Josephson element. In particular, the critical current $I_C$ depends exponentially upon the oxide film thickness. Accordingly, in order to obtain a predetermined value of the critical current $I_C$, the oxide film formation must be accurately controlled to make the oxide film thickness a predetermined thickness.

For example, according to a conventional method of producing a Josephson element utilizing a conventional lift-off method, a photoresist is applied on a substrate (not shown in FIG. 1). The substrate is a single crystalline silicon substrate, a glass substrate, or a single crystalline silicon or glass substrate with a ground plane (e.g. an Nb film) and a dielectric film deposited thereon. The photoresist is exposed to light through a patterned mask, and then developed. As a result, the unnecessary part of the photoresist is removed and then the substrate with the remaining photoresist is cleaned with water. A superconducting material film is deposited on the substrate and the remaining photoresist by a conventional method, e.g. an evaporation method or a sputter deposition method. Then, the remaining photoresist and a part of the deposited film lying on the photoresist are removed at the same time by using a suitable solvent to form a patterned superconducting film, i.e. the first electrode 1. Photoresist is applied again on the substrate and the first electrode, and is exposed to light through another patterned mask and developed. After that, a part of the first electrode 1 is exposed to a water cleaning treatment. When the surface of the first electrode comes in contact with water during the above-mentioned water cleaning treatment and with the atmosphere, an undesired oxide film, of which the quality and thickness are not controlled, is formed on the first electrode 1. In order to remove the undesired oxide film from the first electrode 1, the exposed surface of the first electrode is subjected to sputter etching in an argon atmosphere. Immediately after the sputter etching, the exposed surface of the first electrode is oxidized by a thermal oxidation process, a dc oxygen glow discharge process or an rf oxygen glow discharge process to form the desired oxide film 3 serving as a tunneling barrier. Then, another superconducting material film is deposited on the remaining photoresist and the oxide film by the above-mentioned deposition method. The remaining photoresist and a part of the deposited film are removed at the same time by using a suitable solvent to form a patterned superconducting film, i.e. the second electrode 2. Thus, the Josephson element of the tunneling junction type is completed.

However, the above-mentioned sputter etching in an argon atmosphere often generates hillocks which protrude through the subsequently formed oxide film 3 and induce microshorts on the surface of the first electrode 1.

SUMMARY OF THE INVENTION

An object of the present invention is to provide an improved method of producing a Josephson element of the tunneling junction type without the sputter etching treatment in an argon atmosphere.

Another object of the present invention is to repress formation of an undesired oxide film on the first electrode of the Josephson element.

Still another object of the present invention is to provide a desired thickness of a barrier oxide film.

In accordance with the present invention, the foregoing and other objects are attained by an improved method of producing a Josephson element of the tunneling junction type in which the improvement comprises the step, immediately after deposition of a superconducting material film for the first electrode, of oxidizing the superconducting material film in the same apparatus as was used for depositing the superconducting material.

BRIEF DESCRIPTION OF THE DRAWINGS

The present invention will be better understood upon reading the following description in connection with the accompanying drawing in which.

DETAILED DESCRIPTION OF THE PREFERRED EMBODIMENTS

Figure 1:
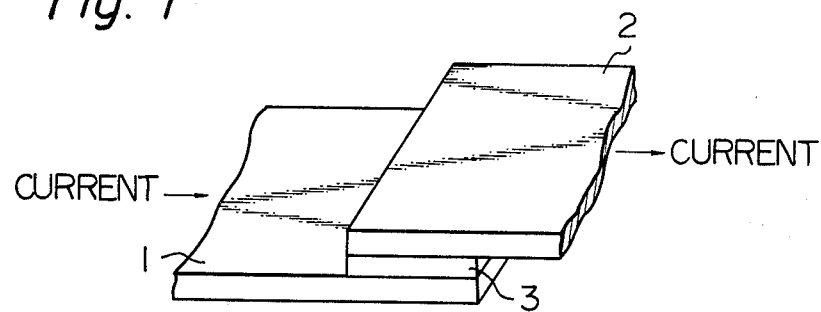
FIG. 1 is a perspective view of a Josephson element of the tunneling junction type.
Figure 2:
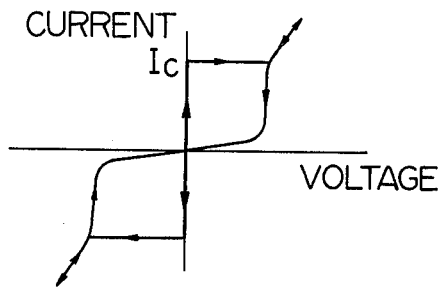
FIG. 2 is a diagram showing the current-voltage characteristic of the Josephson element.
Figure 3:
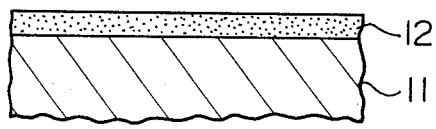
FIGS. 3 through 12 are cross-sectional views of various stages of production of the Josephson element in accordance with the present invention.
Figure 4:
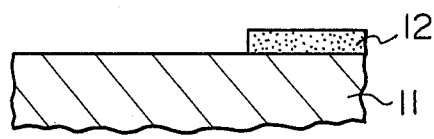
Figure 5:
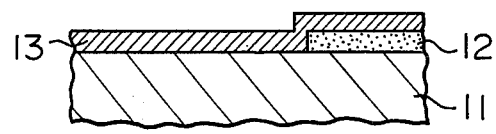

As shown in FIG. 3, a photoresist is applied on a substrate 11 made of single crystalline silicon or glass to form a photoresist film 12. The photoresist film 12 is formed into a desired shape by a conventional technique, as shown in FIG. 4. In order to form the first electrode, a superconducting material film 13 is formed on the substrate 11 and the photoresist film 12 by a conventional deposition method, as shown in FIG. 5. The superconducting material includes at least one material from the group consisting of lead, indium, niobium, niobium-nitride and lead-gold alloy. It is preferable to form the film 13 for the first electrode by a sequential evaporation of gold and lead-indium alloy or by a sequential evaporation of gold, lead and indium.

Prior to the formation of the film 13, it is also preferable to sputter-etch the substrate 11 and the photoresist film 12 in an argon atmosphere for a short period to remove moisture and contaminants from the surfaces thereof and to increase the adhesion properties of the deposited film 13 to the substrate 11.

Figure 6:
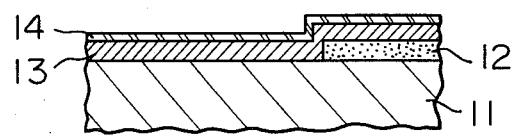

According to the present invention, immediately after the above-mentioned formation of the superconducting material film 13, the film 13 is oxidized by a conventional oxidation process, e.g. a thermal oxidation process, a dc oxygen glow discharge process or an rf oxygen glow discharge process in the same apparatus which is used for depositing the film 13 to form an oxide film 14, as shown in FIG. 6. The formed oxide film 14 has a thickness of from approximately 10 angstroms to approximately 100 angstroms. It is preferable to carry out the oxidation by maintaining an rf oxygen glow discharge in an oxygen pressure of from $1 \times 10^{-3}$ to $1 \times 10^{-1}$ Torr at an rf power density of from $5 \times 10^{-3}$ to $2 \times 10^{-1}$ W/cm$^2$ for a period of from 1 to 30 minutes.

Figure 7:
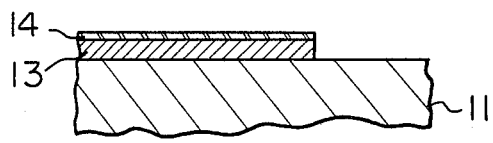

Then, the remaining photoresist film 12 is removed from the substrate 11 by a suitable solvent, e.g. acetone. It is preferable to wash the substrate in an acetone bath with the aid of ultrasound. When the photoresist film 12 is removed, a part of the superconducting material film 13 lying on the photoresist film 12 is removed at the same time, i.e. lifted-off. Thus, the remaining superconducting material film 13 forms the first electrode, as shown in FIG. 7. The oxide film 14 then comes into contact with the atmosphere.

Figure 8:
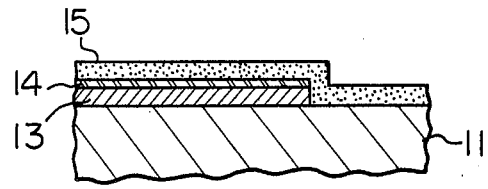
Figure 9:
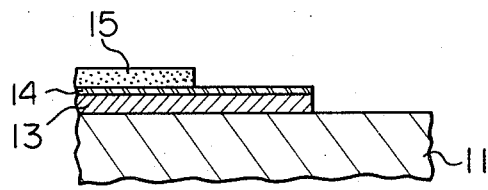

Another photoresist film 15 is formed on the substrate 11 and on the oxide film above the first electrode 13 by applying a photoresist which is similar to the photoresist used for the photoresist film 12, as shown in FIG. 8. Then, the photoresist film 15 is formed into a desired shape by a conventional technique, as shown in FIG. 9. In this case, since the substrate is cleaned with water, uncovered parts of the oxide film 14 and the substrate 11 come into contact with the water.

Since the oxide film 14 is already formed on the first electrode 13 in accordance with the present invention, the first electrode 13 cannot come into contact with the water. However, during the above-mentioned contact between the oxide film 14 and the atmosphere and water, the oxidation of the first electrode 13 proceeds to a slight degree, so that the thickness of the oxide film 14 increases.

Figure 10:
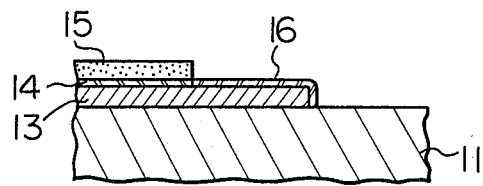

According to the present invention, instead of using sputter etching in an argon atmosphere, the uncovered part of the oxide film 14 (FIG. 9) can be oxidized again by the rf oxygen glow discharge process. Since the rf oxygen glow discharge process has a sputter-etching effect and an oxidizing effect, the upper part of the oxide film 14 is sputter-etched and simultaneously the first electrode 13 is further oxidized. If a balance between the sputter-etching and oxidizing rates is controlled, the predetermined oxide film 16 of the tunneling barrier is formed, as shown in FIG. 10.

Figure 11:
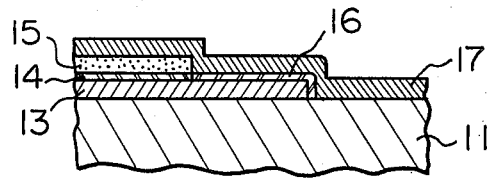
Figure 12:
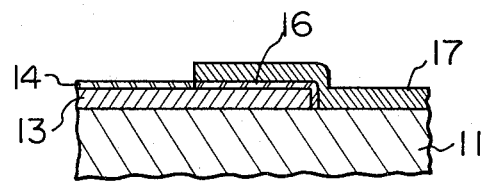

Then, a superconducting material film 17 for the second electrode is deposited without breaking the vacuum condition on the substrate 11, the oxide film 16 (which covers the first electrode 13), and the photoresist film 15, as shown in FIG. 11. The superconducting material film 17 is made of lead, lead-indium alloy, lead-gold alloy, or the like. It is preferable to form the film 17 by sequential evaporation of lead and gold.

Finally, the remaining photoresist film 15 is removed in the above-mentioned conventional manner. A part of the superconducting material film 17 laying on the photoresist film 15 is simultaneously removed and the remainder of the film 17 forms the second electrode 17. Thus, the Josephson element of the tunneling junction type is completed.

EXAMPLE

A photoresist film of approximately 2 μm thick was formed on the (100) surface of a single crystalline silicon wafer. The photoresist film was formed into a predetermined shape for the first electrode by a conventional technique. The silicon wafer and the photoresist film were sputter-etched in an argon atmosphere having a pressure of $1 \times 10^{-2}$ Torr with an rf power of 50 W for a period of 1 minute. The first electrode film was formed by sequential evaporation of 80 Å of Au and 2000 Å of Pb.In (the concentration of In being 10 wt.%).

Immediately after the evaporation, the Pb.In film of the electrode film was oxidized by the rf oxygen glow discharge process at an oxygen pressure of $1 \times 10^{-2}$ Torr with an rf power of 5 W (a power density of $3 \times 10^{-2}$ W/cm$^2$) for a period of 10 minutes to form an oxide film.

Then, the silicon wafer with the shaped photoresist film and the first electrode film is washed in an acetone bath with the aid of ultrasound to remove the photoresist film and the unnecessary part of the first electrode film. A photoresist film approximately 2 μm thick was formed on the silicon wafer and the first electrode. The photoresist film was formed into a predetermined shape for the second electrode by a conventional technique including a water cleaning step. Thus, parts of the silicon wafer and the oxide film on the first electrode were exposed to water and also to the atmosphere when removing the unnecessary part of the photoresist film.

The exposed oxide film on the first electrode was subjected to the oxygen glow discharge process at an oxygen pressure of $1 \times 10^{-2}$ Torr with an rf power of 5 W ($3 \times 10^{-2}$W/cm$^2$) for a period of 10 minutes. Owing to the rf oxygen glow discharge a part of the exposed oxide film was sputter-etched and simultaneously the part of the first electrode underlying the exposed oxide film was further oxidized, so that a predetermined oxide film serving as a tunneling barrier was obtained. The obtained barrier oxide film was 50 angstroms thick.

Figure 13:
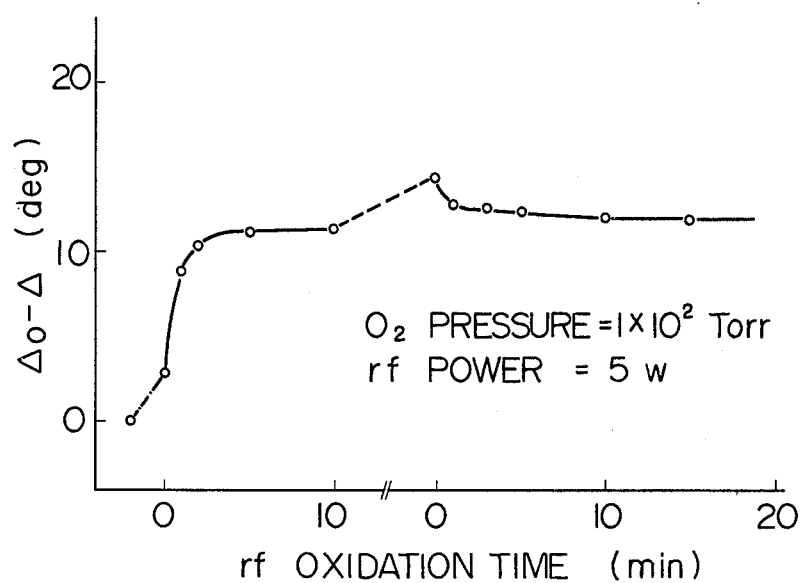
FIG. 13 is a diagram showing the change in $(\Delta_0 - \Delta)$, which is proportional to the thickness of the oxide film, during the oxidation by the rf oxygen glow discharge method.

The thickness variation of the oxide film was observed by using an ellipsometer. The observation results are illustrated in FIG. 13. The oxide film thickness is represented by the change in the delta parameter, $(\Delta_0 - \Delta)$, of the ellipsometric parameters. In FIG. 13, the broken line represents the variation of the thickness of the oxide film caused by the water cleaning treatments during the period between the oxidation treatments by the rf oxygen glow discharge.

After the formation of the barrier oxide film, the second electrode film was formed by sequential evaporation of 2000 Å of Pb, 80 Å of Au and 2000 Å of Pb. The substrate covered with the second electrode film was washed in the acetone bath with the aid of ultrasound to remove the remaining photoresist film and the unnecessary part of the second electrode film. Accordingly, a Josephson element of the tunneling junction type was produced.

It will be obvious that the present invention is not restricted to the above-described embodiment and example, and that many variations are possible for those skilled in the art without departing from the scope of the present invention. For example, it is possible to use a chemical etching method instead of the lift-off method for obtaining the desired shapes of the electrodes.

What is claimed is:

1. In a method of producing a Josephson element of the tunneling junction type comprising the steps of forming a first electrode of the element on a substrate, by deposition of a first superconductor material layer in an evacuated apparatus for film deposition by utilizing a first photoresist film, forming a barrier oxide film on said first electrode, and forming a second electrode of the element by deposition of a second superconductor material layer on said barrier oxide film by utilizing a second photoresist film, the improvement comprising:

immediately after the deposition in said deposition apparatus of the first superconducting material film of said first electrode, oxidizing the upper portion of said superconducting material film in the same said deposition apparatus, prior to removing said substrate from said deposition apparatus thereby avoiding exposing said first superconducting material to undesired contamination and oxidation, subsequently controllably forming said barrier oxide film to a predetermined thickness by an rf oxygen glow discharge process having both a sputter-etching effect and an oxidizing effect.

2. The method of claim 1 comprising selectively performing said immediate oxidizing of said superconducting material film by thermal oxidation, dc oxygen glow discharge, or rf oxygen glow discharge.

3. The method of claim 1, wherein said controlled forming of the thickness of said barrier oxide film by said rf oxygen glow discharge is at an oxygen pressure of from $1 \times 10^{-3}$ to $1 \times 10^{-1}$ Torr at an rf power density of from $5 \times 10^{-3}$ to $2 \times 10^{-1}$ W/cm$^2$ for a period of from 1 to 30 minutes.

4. The method of claim 1, wherein each said superconducting material includes at least one material selected from the group consisting of lead, niobium, niobium-nitride, indium and a lead-gold alloy.

5. The method of claim 1, 2 or 3, comprising forming said barrier oxide film to have said predetermined thickness in a range between 10 and 100 angstroms.

6. The process of claim 1, 2, 3 or 4, comprising depositing the second layer of superconducting material on said barrier oxide film having said predetermined thickness, after its formation by said controllable rf oxygen glow discharge process, prior to removing said substrate from the deposition apparatus thereby avoiding exposing said barrier oxide layer to undesired contamination and oxidation.

7. The process of claim 6, comprising controllably forming said barrier oxide film to have said predetermined thickness in a range between 10 and 100 angstroms.

8. The process of claim 6, comprising patterning the second photoresist film before said controllable forming of said barrier oxide film to a predetermined thickness by said rf oxygen glow discharge process.

9. The process of claim 6, comprising forming said first photoresist with a pattern corresponding to said first electrode, before the deposition of said first layer of the superconducting material of said first electrode.

10. The process of claim 1, 2, 3 or 4, comprising patterning the second photoresist film before said controllable forming of said barrier oxide film to a predetermined thickness by said rf oxygen glow discharge process.

* * * * *

UNITED STATES PATENT AND TRADEMARK OFFICE
CERTIFICATE OF CORRECTION

PATENT NO. : 4,299,679

DATED : November 10, 1981

INVENTOR(S) : Hideo Suzuki

It is certified that error appears in the above—identified patent and that said Letters Patent is hereby corrected as shown below:

Front page, [56], PUBLICATIONS, second column, line 4, "RF-Sputtering & Photolithographic" s/b --rf-Sputtering and Photolytographic--;

Front page, [57], ABSTRACT, line 6, after "process" insert --,--;
line 7, after "wherein" insert --;--.

Column 1, line 15, after "a" delete "the";
line 43, after "to" insert --a--;
line 55, after "to" insert --a--.

Column 2, line 40, "drawing" s/b --drawings--.

Column 3, line 27, "lifted-off" s/b --lifted off--;
line 29, "then" s/b --thus--;
line 36, after "by" change "a" to --the--.

Column 4, line 17, "Pb.In" s/b --Pb·In--;
line 19, "Pb.In" s/b --Pb·In--.

Column 5, line 22, after "oxidation," insert --and--.

Signed and Sealed this

Fifteenth Day of June 1982

[SEAL]

Attest:

GERALD J. MOSSINGHOFF

Attesting Officer    Commissioner of Patents and Trademarks